United States Patent
Grout

(10) Patent No.: US 11,171,656 B2
(45) Date of Patent: Nov. 9, 2021

(54) DIVIDERLESS PLL WITH SAMPLED LOWPASS FILTER STRUCTURE

(71) Applicant: Kevin S. Grout, Chandler, AZ (US)

(72) Inventor: Kevin S. Grout, Chandler, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 17/121,074

(22) Filed: Dec. 14, 2020

(65) Prior Publication Data

US 2021/0184686 A1    Jun. 17, 2021

Related U.S. Application Data

(60) Provisional application No. 62/947,807, filed on Dec. 13, 2019.

(51) Int. Cl.
| | |
|---|---|
| *H03L 7/089* | (2006.01) |
| *H03L 7/099* | (2006.01) |
| *H03L 7/093* | (2006.01) |

(52) U.S. Cl.
CPC ............ *H03L 7/0895* (2013.01); *H03L 7/093* (2013.01); *H03L 7/0995* (2013.01)

(58) Field of Classification Search
CPC ....... H03L 7/085; H03L 7/089; H03L 7/0891; H03L 7/0895; H03L 7/0896; H03L 7/0868; H03L 7/093; H03L 7/099; H03L 7/0995; H03L 7/0996; H03L 7/0997; H03L 7/0998
See application file for complete search history.

(56) References Cited

U.S. PATENT DOCUMENTS

| | | | | |
|---|---|---|---|---|
| 5,920,233 A | * | 7/1999 | Denny ................... | H03L 7/0891 331/14 |
| 6,114,888 A | * | 9/2000 | Walley ...................... | H03L 7/18 327/157 |
| 6,791,379 B1 | * | 9/2004 | Wakayama ........... | H03L 7/0996 327/156 |
| 9,768,684 B1 | * | 9/2017 | Banerjee ................... | G06F 1/04 |

(Continued)

OTHER PUBLICATIONS

U.S. Appl. No. 17/154,437, filed Jan. 21, 2012, Grout.

(Continued)

*Primary Examiner* — Diana J. Cheng

(74) *Attorney, Agent, or Firm* — Withrow & Terranova, P.L.L.C.

(57) ABSTRACT

The present disclosure relates to a phase-lock-loop, which includes a phase detector (PD), a charge pump (CP), a sampled lowpass filter structure, and a voltage-controlled oscillator (VCO) structure. The PD is configured to receive a RF output signal from the VCO structure and a reference signal, and generate detection signals, which indicate a phase relationship between the RF output signal and the reference signal. The CP is configured to receive the detection signals and generate a CP current. Herein, the CP current flows into or out of the sampled lowpass filter structure based on the detection signals. The sampled lowpass filter is configured to provide an oscillator control voltage, which remains constant within a cycle of the reference signal, to the VCO structure based on the CP current. Based on the oscillator control voltage, the VCO structure is configured to tune the RF output signal.

13 Claims, 10 Drawing Sheets

(56) References Cited

U.S. PATENT DOCUMENTS

| | | | | |
|---|---|---|---|---|
| 2002/0025015 | A1* | 2/2002 | Notani | H03L 7/0895 375/376 |
| 2016/0254818 | A1* | 9/2016 | Luo | H03L 7/089 327/159 |

OTHER PUBLICATIONS

Choi, S. et al., "A 185fsrms-Integrated-Jitter and -245dB FOM PVT-Robust Ring-VCO-Based Injection-Locked Clock Multiplier with a Continuous Frequency-Tracking Loop Using a Replica-Delay Cell and a Dual-Edge Phase Detector," 2016 IEEE International Solid-State Circuits Conference (ISSCC 2016), Session 10, Advanced Wireline Transceivers and PLLs, 10.7, Feb. 2, 2016, IEEE, pp. 194-196.

Chuang, J. et al., "A 0.0049mm2 2.3GHz Sub-Sampling Ring-Oscillator PLL with Time-Based Loop Filter Achieving-236.2dB Jitter-FOM," 2017 IEEE International Solid-State Circuits Conference (ISSCC 2017), Session 19, Frequency Generation, 19.4, Feb. 8, 2017, pp. 328-330.

Gao, X. et al., "A Low Noise Sub-Sampling PLL in Which Divider Noise is Eliminated and PD/CP Noise is Not Multiplied by N2," IEEE Journal of Solid-State Curcuits, vol. 44, No. 12, Dec. 2009, IEEE, pp. 3253-3263.

Gao, X. et al., "Sub-Sampling PLL Techniques," 2015 IEEE Custom Integrated Circuits Conference (CICC), Sep. 28-30, 2015, San Jose, CA, USA, IEEE, 8 pages.

Johansson, H.O., "A Simple Precharged CMOS Phase Frequency Detector," IEEE Journal of Solid-State Circuits, vol. 33, No. 2, Feb. 1998, IEEE, pp. 295-299.

Liao, D. et al., "A Low-Noise Inductor-less Fractional-N Sub-Sampling PLL with Multi-Ring Oscillator," 2017 IEEE Radio Frequency Integrated Circuits Symposium (RFIC), Jun. 4-6, 2017, Honolulu, HI, USA, IEEE, pp. 108-111.

Nagam, S. et al., "A 0.008mm2 2.4GHz Type-I Sub-Sampling Ring-Oscillator-based Phase-Locked Loop with a-239.7dB FoM and -64dBc Reference Spurs," 2018 IEEE Custom Integrated Circuits Conference (CICC), Apr. 2018, San Diego, CA, 4 pages.

Nagam, S. et al., "A Low-Jitter Ring-Oscillator Phase-Locked Loop Using Feedforward Noise Cancellation With a Sub-Sampling Phase Detector," IEEE Journal of Solid-State Circuits, vol. 53, Issue 3, Jan. 26, 2018, IEEE, 12 pages.

Razavi, B., "Principles of Data Conversion System Design," IEEE Press, 1995, 136 pages.

Seong, T. et al., "A-242-dB FOM and -71-dBc Reference Spur Ring-VCO-Based Ultra-Low-Jitter Switched-Loop-Filter PLL Using a Fast Phase-Error Correction Technique," 2017 Symposium on VLSI Circuits Digest of Technical Papers, Jun. 5-8, 2017, Kyoto, 2 pages.

Szortyka, V. et al., "A 42 mW 200 fs-Jitter 60 GHz Sub-Sampling PLL in 40 nm CMOS," IEEE Journal of Solid-State Circuits, vol. 50, No. 9, Sep. 2015, IEEE, 12 pages.

Wang, H. et al., "A 9.6 mW Low-Noise Millimeter-Wave Sub-Sampling PLL with a Divider-less Sub-Sampling Lock Detector in 65 nm CMOS," 2019 IEEE Radio Frequency Integrated Circuits Symposium (RFIC), Jun. 2-4, 2019, Boston, MA, USA, IEEE, pp. 171-174.

Yang, X. et al., "A-246dB Jitter-FoM 2.4GHz Calibration-Free Ring-Oscillator PLL Achieving 9% Jitter Variation Over PVT," 2019 IEEE International Solid-State Circuits Conference (ISSCC 2019), Session 16, Frequency Syntehsizers, 16.3, Feb. 19, 2019, IEEE, pp. 260-262.

* cited by examiner

DIVIDERLESS PLL WITH SAMPLED LOWPASS FILTER STRUCTURE

RELATED APPLICATIONS

This application claims the benefit of provisional patent application Ser. No. 62/947,807, filed Dec. 13, 2019, the disclosure of which is hereby incorporated herein by reference in its entirety.

FIELD OF THE DISCLOSURE

The present disclosure relates to a phase-lock-loop (PLL), and more particularly to a dividerless PLL with a sampled lowpass filter structure.

BACKGROUND

The transmission of high-speed data requires extremely low noise carrier frequency generation. As the market for wearable, carry-able, and implantable electronics continues to grow, the demand for low power, small form factor electronics continues to rise. As LC tanks often take up the majority of the area in a radio's frequency synthesizer, it is desirable to replace these tanks with smaller digital oscillators, such as ring oscillators. Unfortunately, ring oscillators often have inferior noise performance to higher Q resonators. In order to reduce the in-band noise to acceptable levels, sub-sampling phase-lock-loops (SSPLLs) have been utilized.

The SSPLLs do not require an explicit frequency divider circuitry in the core loop, as shown in FIG. 1. Since no divider is present, the SSPLLs do not exhibit the phase-detector (PD)/charge-pump (CP) $N^2$ noise that dominates the in-band noise of traditional PLLs (N refers to a ratio of the output frequency to the reference input frequency). However, these SSPLLs rely on highly accurate, high speed analog sampling of the voltage-controlled oscillator (VCO) output waveform. This places significant design constraints on the design of the sampling circuitry, which often yields large power and area overheads. Additionally, the sampling circuitry must deal with issues arising from pedestal and aperture errors. Lastly, many SSPLL architectures require the CP to be able to provide an analog range of currents. If the CP is not entirely linear, this will cause nonlinearity in the overall loop dynamics. This effect is especially prominent in deep sub-micron processes, where there is significant channel length modulation.

Accordingly, there remains a need for an improved PLL design, which has a same loop transfer function as a SSPLL without sacrificing large power and area overheads. In addition, there is also a need to mitigate pedestal and aperture errors and enhance the linearity of the CP.

SUMMARY

The present disclosure relates to a phase-lock-loop (PLL), which includes a phase detector (PD), a charge pump (CP), a sampled lowpass filter structure, and a voltage-controlled oscillator (VCO) structure. The VCO structure is configured to generate a radio frequency (RF) output signal. The PD is configured to receive a reference signal and the RF output signal, and configured to generate detection signals, which indicate a phase relationship between the reference signal and the RF output signal. The CP is configured to receive the detection signals and generate a CP current. Herein, the CP current flows into or out of the sampled lowpass filter structure based on the detection signals. The sampled lowpass filter is configured to provide an oscillator control voltage, which remains constant within a cycle of the reference signal, to the VCO structure based on the CP current. Based on the oscillator control voltage, the VCO structure is configured to tune the RF output signal.

In one embodiment of the PLL, the sampled lowpass filter structure includes a lowpass filter (LPF) placed after the CP and a sample-and-hold (SH) block placed after the LPF. The LCP includes a ripple rejection capacitor coupled to the CP. When the CP current flows into the LPF, the ripple rejection capacitor is charged, and a filter voltage on the ripple rejection capacitor increases. When the CP current flows out of the LPF, the ripple rejection capacitor is discharged, and the filter voltage on the ripple rejection capacitor decreases. The SH block is configured to sample the filter voltage and configured to provide the oscillator control voltage.

In one embodiment of the PLL, the SH block is configured to sample the filter voltage at a rate equal to the reference frequency.

In one embodiment of the PLL, the SH block includes a holding capacitor and a sampling circuit coupled between the ripple rejection capacitor of the LPF and the holding capacitor. Herein, the sampling circuit is configured to allow only one value of the filter voltage to pass per cycle of the reference signal, and the passed value of the filter voltage is the oscillator control voltage. The holding capacitor is configured to hold the oscillator control voltage and provide a constant voltage value to the VCO structure per cycle of the reference signal.

In one embodiment of the PLL, the sampling circuit is implemented by a transmission gate.

In one embodiment of the PLL, the sampling circuit is controlled by a SAMPLE signal, which pulses per cycle of the reference signal and pulses based on the detection signals.

In one embodiment of the PLL, the sampling circuit is controlled by a SAMPLE signal, which pulses every M cycles of the reference signal. Herein, M is a positive integer.

In one embodiment of the PLL, the sampling circuit is controlled by a SAMPLE signal, which pulses M times per cycle of the reference signal. Herein, M is a positive integer.

In one embodiment of the PLL, the CP includes a current mirror configuration to set the CP current. The current mirror configuration is configured such that a current amount supplied to the ripple rejection capacitor during the charging period and a current amount drawn from the ripple rejection capacitor during the discharging period are equal within a cycle of the RF output signal. As such, the filter voltage on the ripple rejection capacitor has a net zero change for a cycle of the RF output signal.

In one embodiment of the PLL, the CP further includes a charge injection cancellation circuit, which is configured to cancel charge injection generated at the current mirror configuration during the charging and discharging periods.

In one embodiment of the PLL, there is no divider in a feedback loop between the VCO structure and the PD.

In one embodiment of the PLL, the PD has a pre-charged topology.

In one embodiment of the PLL, the VCO structure includes at least one multi-stage differential ring oscillator and a multiplexer. Herein, the oscillator control voltage is fed to the at least one multi-stage differential ring oscillator.

In one embodiment of the PLL, the at least one multi-stage differential ring oscillator has a number of delay stages, each of which is configured to receive the oscillator control voltage and corresponds to an oscillator output pair. Each oscillator output pair, which has a same frequency with a different phase, is coupled to inputs of the multiplexer. The multiplexer is configured to select an output signal with a desired phase from each oscillator output pair of the at least one multi-stage differential ring oscillator.

In one embodiment of the PLL, the VCO structure further includes an inverter chain, which is configured to boost signal drive strength of the selected output signal to provide the RF output signal.

In one embodiment of the PLL, each delay stage includes frequency range selection circuitry, which is configured to choose an RF output frequency range. The VCO structure is tuning the RF output signal within the chosen RF output frequency range.

In one embodiment of the PLL, the at least one multi-stage differential ring oscillator includes a number of multi-stage differential ring oscillators. Each multi-stage differential ring oscillator is configured to provide a different RF output frequency range for tuning the RF output signal. Each multi-stage differential ring oscillator corresponds to one oscillator output pair and has a number of delay stages. The oscillator control voltage is fed to each delay stage. The oscillator output pair of each multi-stage differential ring oscillator is coupled to inputs of the multiplexer. The multiplexer is configured to select one of the multi-stage differential ring oscillators for tuning the RF output signal within a desired RF output frequency range.

In one embodiment of the PLL, the VCO structure includes one of a current starved ring oscillator, an LC tank, a positive feedback oscillator, a tunable crystal oscillator, a varactor based oscillator, a rotary travelling wave oscillator, a tunable microstrip oscillator, and a tunable cavity resonator.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
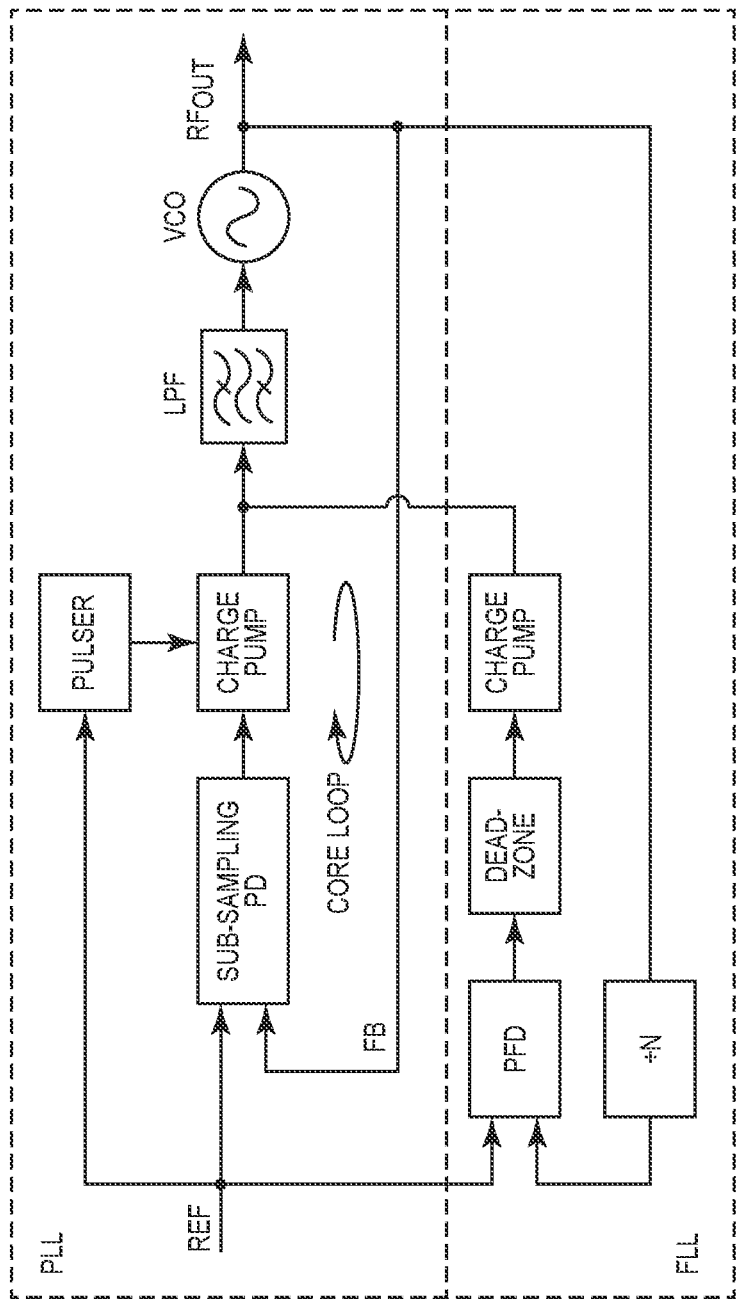
FIG. 1 shows a conventional sub-sampling phase-lock-loop (SSPLL) block diagram.

It will be understood that for clear illustrations, FIGS. 1-13 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" or "over" or "under" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Figure 2:
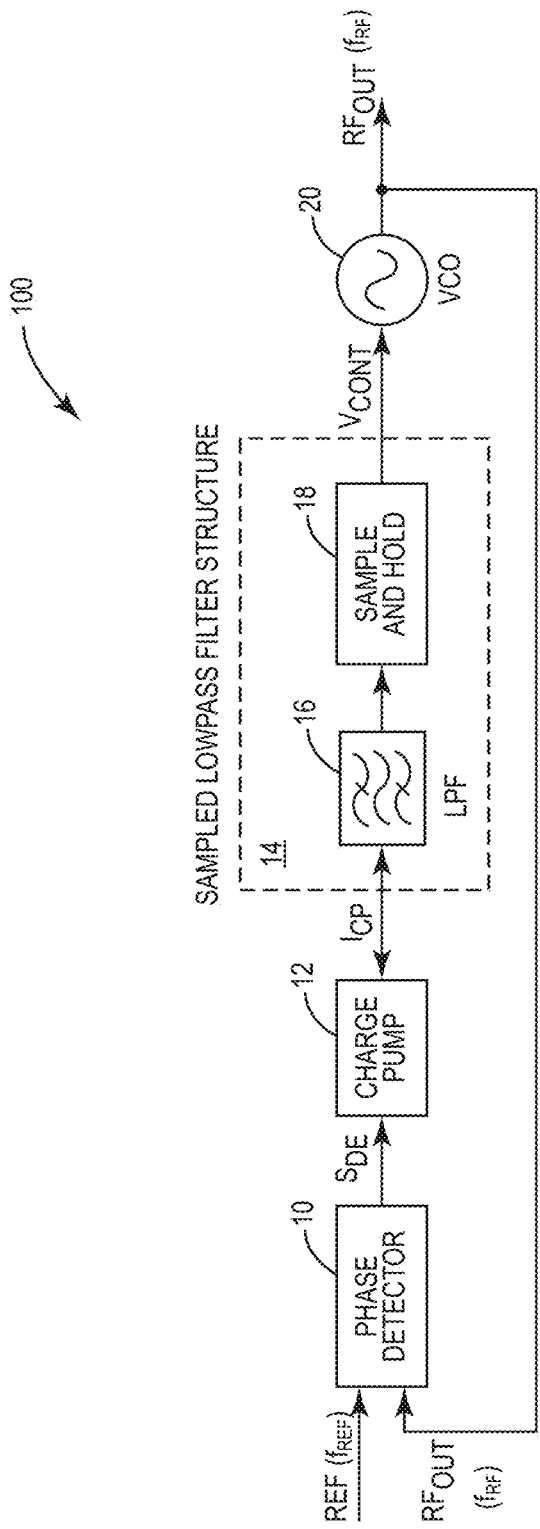
FIG. 2 shows a phase-lock-loop (PLL) with a sampled lowpass filter structure according to one embodiment of the present disclosure.

The present disclosure relates to a dividerless phase-lock-loop (PLL) with a compact physical size and improved noise performance. FIG. 2 shows an exemplary PLL 100 according to one embodiment of the present disclosure, The PLL 100 is configured to receive a reference signal REF with a reference frequency $f_{REF}$, and to provide a radio frequency (RF) output signal $RF_{OUT}$ with an RF output frequency $f_{RF}$. Herein, the reference frequency $f_{REF}$ is constant and associated with a desired output frequency of the RF output signal $RF_{OUT}$. The PLL 100 includes a phase detector (PD) 10, a charge pump (CP) 12, a sampled lowpass filter structure 14 with a lowpass filter (LPF) 16 and a sample-and-hold (SH) block 18, and a voltage-controlled oscillator (VCO) structure 20. It is clear that the PLL 100 is a dividerless PLL, which has no divider in a feedback loop between the VCO structure 20 and the PD 10.

Figure 3:
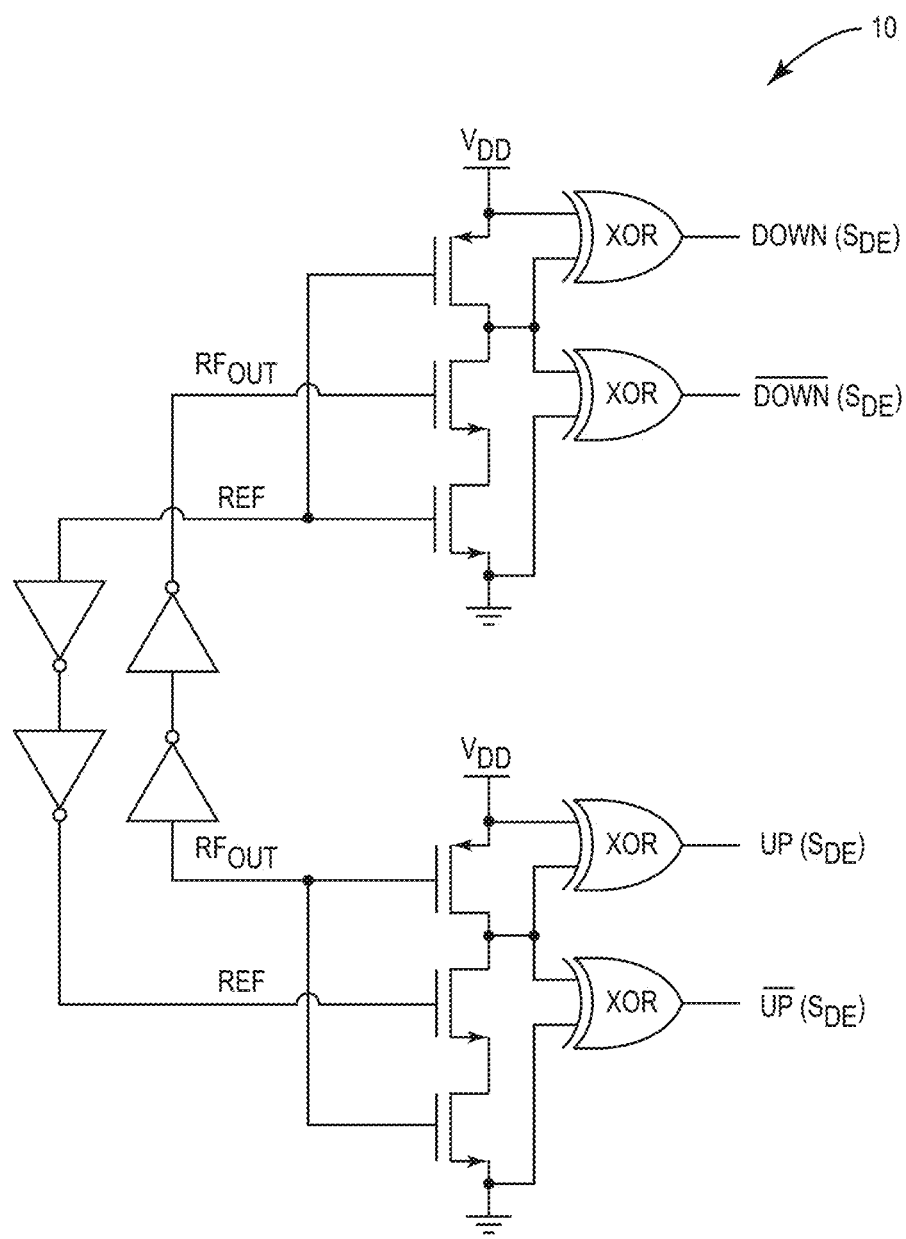
FIG. 3 shows a phase detector (PD) schematic in the PLL shown in FIG. 2.

In detail, the RF output signal $RF_{OUT}$ from the VCO structure 20 is fed to the PD 10 to be compared with the reference signal REF, and the PD 10 is configured to generate detection signals $S_{DE}$, which indicates a phase relationship between the reference signal REF and the RF output signal $RF_{OUT}$. In one embodiment, the PD 10 may have a pre-charged topology as shown in FIG. 3. Herein, the detection signals $S_{DE}$ include a DOWN output signal, a $\overline{\text{DOWN}}$ output signal, an UP output signal, and an $\overline{\text{UP}}$ output signal. When both the RF output signal $RF_{OUT}$ and the reference signal REF are "1", the DOWN output signal is "1", the $\overline{\text{DOWN}}$ output signal is "0", the UP output signal is "1", and the $\overline{\text{UP}}$ output signal is "0". When the RF output signal $RF_{OUT}$ is "0" and the reference signal REF is "1," the DOWN and $\overline{\text{DOWN}}$ output signals hold the previous states, the UP output signal is "0," and the $\overline{\text{UP}}$ output signal is "1." When both the RF output signal $RF_{OUT}$ and the reference signal REF are "0", the DOWN output signal is "0," the $\overline{\text{DOWN}}$ output signal is "1," the UP output signal is "0," and the $\overline{\text{UP}}$ output signal is "1." When the RF output signal $RF_{OUT}$ is "1" and the reference signal REF is "0," the DOWN output signal is "0," the $\overline{\text{DOWN}}$ output signal is "1," the UP and $\overline{\text{UP}}$ output signals hold the previous states. When the RF output signal $RF_{OUT}$ leads, lags, or locks with the reference signal REF, the detection signals $S_{DE}$ will provide different "1" and "0" sequences, so as to increase or decrease a voltage for controlling the VCO structure 20 (more details are described in the following paragraphs).

The CP 12 is configured to receive the detection signals $S_{DE}$ (the DOWN output signal, the $\overline{\text{DOWN}}$ output signal, the UP output signal, and the $\overline{\text{UP}}$ output signal) and generate a CP current $I_{CP}$ based on the detection signals $S_{DE}$. The sampled lowpass filter structure 14, which is immediately after the CP 12, includes the sample-and-hold (SH) block 18 and the lowpass filter (LPF) 16 coupled between the CP 12 and the SH block 18. Herein, the CP current $I_{CP}$ generated by the CP 12 may flow into or flow out of the sampled lowpass filter structure 14 based on the detection signals $S_{DE}$. Based on the direction and/or duration of the CP current $I_{CP}$, the sampled lowpass filter structure 14 is configured to provide an oscillator control voltage $V_{cont}$ to the VCO structure 20 to tune the RF output signal $RF_{OUT}$.

Figure 4:
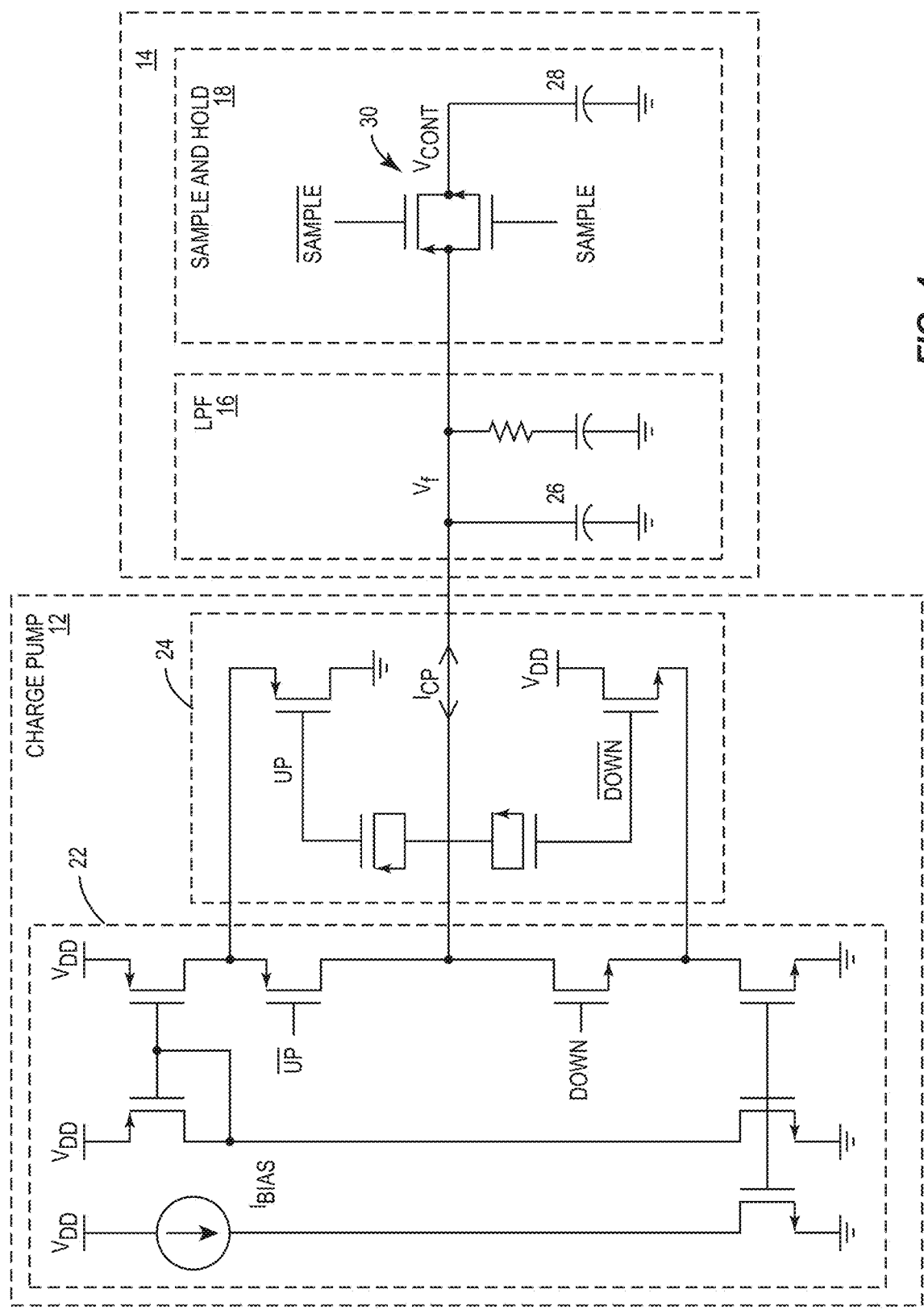
FIG. 4 shows a schematic of a charge pump (CP) and the sampled lowpass filter structure in the PLL shown in FIG. 2.

FIG. 4 shows an exemplary schematic of the CP 12 and the sampled lowpass filter structure 14. The CP 12 includes a current mirror configuration 22, which is used to set the CP current $I_{CP}$. Herein, when the received $\overline{\text{UP}}$ output signal is "0" and the received DOWN output signal is "0", the current mirror configuration 22 is configured to provide the CP current $I_{CP}$ flowing into the LPF 16 of the sampled lowpass filter structure 14. When the received $\overline{\text{UP}}$ output signal is "1" and the received DOWN output signal is "1," the current mirror configuration 22 is configured to provide the CP current $I_{CP}$ flowing out of the LPF 16 of the sampled lowpass filter structure 14. The current mirror configuration 22 is designed such that there will be an equal amount of current in charging and discharging periods in a cycle of the RF output signal $RF_{OUT}$ (more details are described in the following paragraphs). Besides the current mirror configuration 22, the CP 12 may also include a charge injection cancellation circuit 24, which is configured to cancel charge injection generated at the current mirror configuration 22 during the charging and discharging periods.

The LPF 16 includes a ripple rejection capacitor 26 coupled to the CP 12. When the CP current $I_{CP}$ flows into the LPF 16, the ripple rejection capacitor 26 is charged, and a filter voltage Vf on the ripple rejection capacitor 26 increases. When the CP current $I_{CP}$ flows out of the LPF 16, the ripple rejection capacitor 26 is discharged, and the filter voltage $V_f$ on the ripple rejection capacitor 26 decreases. Herein, the current amount supplied to the ripple rejection capacitor 26 during the charging period and the current amount drawn from the ripple rejection capacitor 26 during the discharging period are equal within a cycle of the RF output signal $RF_{OUT}$.

The SH block 18 is immediately after the LPF 16, and is configured to sample the filter voltage $V_f$ and provide the oscillator control voltage $V_{cont}$. In one embodiment, the SH block 18 includes a holding capacitor 28 and a sampling circuit 30 coupled between the ripple rejection capacitor 26 and the holding capacitor 28. The sampling circuit 30 may be implemented by a transmission gate and controlled by a logically generated 'SAMPLE' signal. Herein, the SAMPLE signal may pulse per cycle of the reference signal REF and whenever the DOWN output signal and the UP output signal from the PD 10 have both been low ("0") for at least two inverter propagation delays. This sampling strategy allows only one value of the filter voltage $V_f$ to pass through the sampling circuit 30 per cycle of the reference signal REF, and determines the passed value of the filter voltage $V_f$ as the oscillator control voltage $V_{cont}$. The holding capacitor 28 is configured to hold the oscillator control voltage $V_{cont}$ and provide a constant voltage value to the VCO structure 20 per cycle of the reference signal REF.

In different applications, the SAMPLE signal may have a different pulse rate (other than once per cycle of the reference signal REF). In one embodiment, the SAMPLE signal may pulse every M cycles of the reference signal REF (M is a positive integer number). As such, there is only one value of the filter voltage $V_f$ passing through the sampling circuit 30 every M cycles of the reference signal REF. In another embodiment, the SAMPLE signal may pulse M times per cycle of the reference signal REF (M is a positive integer number). As such, there are M values of the filter voltage $V_f$ passing through the sampling circuit 30 per cycle of the reference signal REF.

In some applications, the sampling strategy may introduce an additional pole in the loop transfer function. However, since the SH block 18 is sampling at a rate equal to the reference frequency REF, which is typically much higher than the PLL's bandwidth, the additional pole will be located at a frequency where the loop transfer function's phase has already passed 180°. In consequence, the additional pole does not significantly affect stability of the loop transfer function. Furthermore, the holding capacitor 28 in the SH block 18 may be much smaller than the ripple rejection capacitor 26 in the LPF 16. For instance, the holding capacitor 28 may be 10 times smaller than the ripple rejection capacitor 26. Because of this relative size difference, the holding capacitor 28 has a negligible effect on filter characteristics of the LPF 16.

Figure 5:
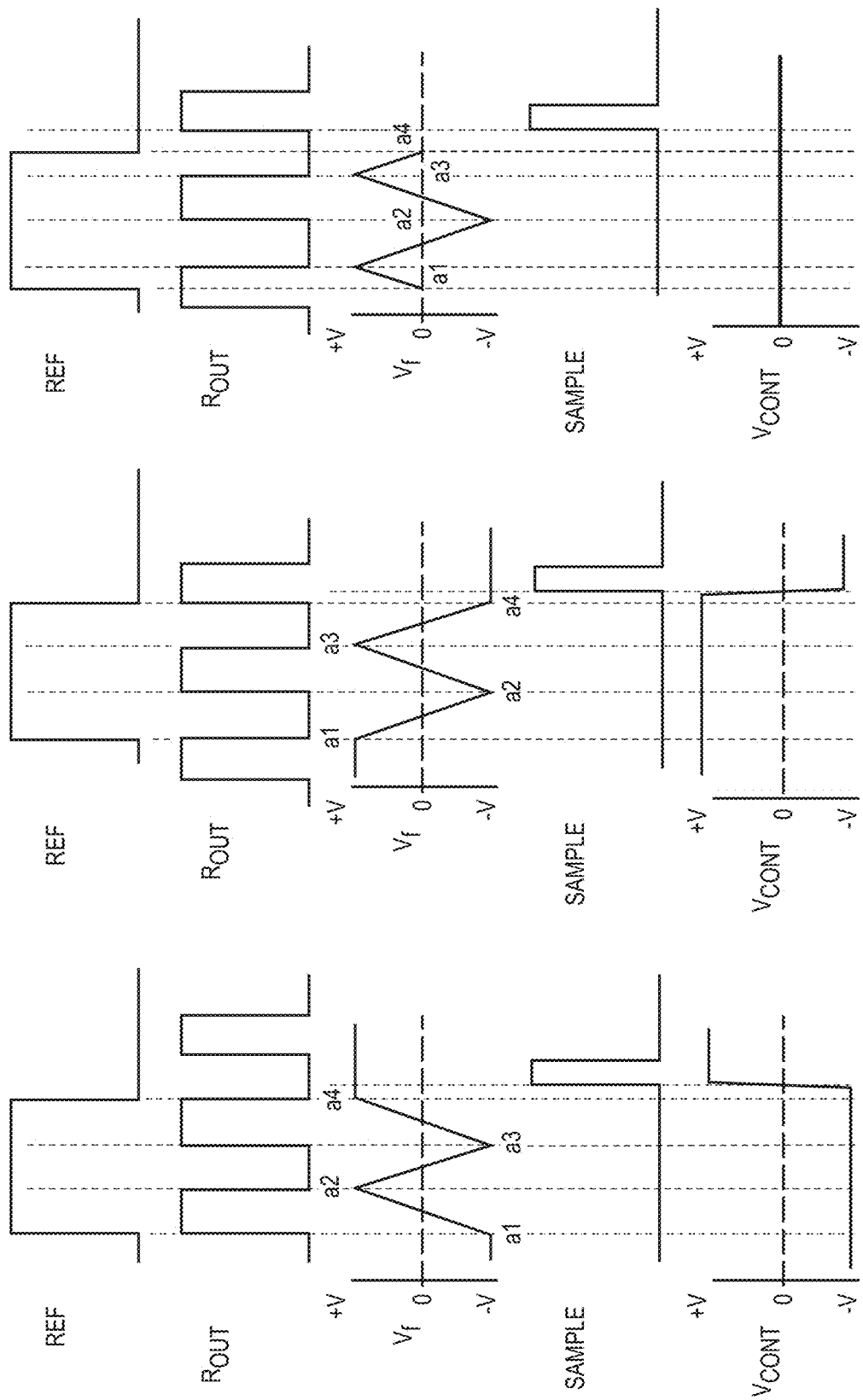
FIG. 5 shows operation examples of the PLL shown in FIG. 2.

FIG. 5 shows graphic operation examples of the disclosed PLL 100. During each duty period of the reference signal REF, there may be floor (N/2) cycles of the RF output signal $RF_{OUT}$. Herein, N is a positive integer, and refers to a ratio of the RF output frequency $f_{RF}$ to the reference frequency $f_{REF}$. Unlike conventional PLLs, this ratio N is not controlled via a loop back divider. Instead, the reference frequency $f_{REF}$ and an RF output frequency range are chosen at the beginning of a locking process (more details are described in the following paragraphs). The RF output frequency $f_{RF}$ will finally be locked at $N*f_{REF}$. During one locking process, N is a fixed positive integer number, which yields the RF output frequency $f_{RF}$ falling into the valid RF output frequency range that was chosen.

For each cycle of the RF output signal $RF_{OUT}$, during one duty period of the reference signal REF, the CP current $I_{CP}$ flows into and out of the LPF 16 to charge and discharge the ripple rejection capacitor 26, respectively. As such, the filter voltage $V_f$ on the ripple rejection capacitor 26 varies with the charging and discharging processes. Since the current mirror configuration 22 in the CP 12 is designed to supply and draw an equal amount of current to and from the ripple rejection capacitor 26 within one cycle of the RF output signal $RF_{OUT}$, there is a net zero change in the filter voltage $V_f$ at the end of each cycle of the RF output signal $RF_{OUT}$. For instance, as shown in FIG. 5(a), a full cycle of the RF output signal $RF_{OUT}$ is from a1 to a3. During a first half of the cycle of the RF output signal $RF_{OUT}$ (from a1 to a2), the ripple rejection capacitor 26 is charged and the filter voltage $V_f$ increases from −V to +V. During a second half of the cycle of the RF output signal $RF_{OUT}$ (from a2 to a3), the ripple rejection capacitor 26 is discharged and the filter voltage $V_f$ decreases from +V back to −V. At the end of the full cycle of the RF output signal $RF_{OUT}$ (at a3), the value of the filter voltage $V_f$ remains −V, the same as at the beginning of the cycle of the RF output signal $RF_{OUT}$ (at a1), and there is a net zero change in the filter voltage $V_f$. As such, for one full cycle of the RF output signal $RF_{OUT}$, the supply-into current and the draw-from current are a corresponding current pair and cancel out each other.

Note that since each full cycle of the RF output signal $RF_{OUT}$ yields one corresponding current pair, which leads to no net value change of the filter voltage $V_f$, it does not matter how many full cycles of the RF output signal $RF_{OUT}$ occur during each duty period of the reference signal REF. Thus, the overall behavior of the PD 10 and the CP 12 is not a function of the ratio, N. As the number of full cycles of the RF output signal $RF_{OUT}$ do not affect the final value of the filter voltage $V_f$, it can be seen that the functionality of the PD 10 and the CP 12 is defined solely by the "non-corresponding current" (e.g. a supply-into current with no corresponding draw-from current to cancel it). For example, in FIG. 5(a), the first upward from a1 to a2 (due to the supply-into current) and downward slope from a2 to a3 (due to the draw-from current) of the $V_f$ cancel out, and only the last upward slope (non-corresponding period) from a3 to a4 (due to the supply-into current) contributes to the final value of the filter voltage $V_f$. Similarly in FIG. 5(b), only the last downward slope (non-corresponding period) from a3 to a4 does not cancel out and contributes to the final value of the filter voltage $V_f$. In FIG. 5(c), it can be seen that all upward and downward slopes in the filter voltage $V_f$ cancel out, thus causing no net change of the filter voltage $V_f$.

The 'Sample' signal is followed to pass the final value of the filter voltage $V_f$ through the sampling circuit 30. The final value of the filter voltage $V_f$ is the oscillator control voltage $V_{cont}$ hold at the holding capacitor 28. Herein, when the oscillator control voltage $V_{cont}$ is positive, like +V in FIG. 5(a), which indicates that the RF output signal $RF_{OUT}$ is leading the reference signal REF. When the oscillator control voltage $V_{cont}$ is negative, like −V in FIG. 5(b), it indicates that the RF output signal $RF_{OUT}$ is lagging the reference signal REF. When the oscillator control voltage $V_{cont}$ is zero, like in FIG. 5(c), it indicates a locked state between the RF output signal $RF_{OUT}$ and the reference signal REF.

Since the corresponding current pair have no net effect on the average current, the value of the filter voltage $V_f$ is effectively the CP current $I_{CP}$ during the non-corresponding period(s) multiplied by the duration of the non-corresponding period(s). The CP gain $\beta_{CP}$ is a function of the CP current $I_{CP}$, as $$\beta_{CP} = \frac{\Delta I_{average}}{\Delta \phi} = \int_0^{T_{Ref}} \frac{I_{CP}}{2\pi \cdot T_{Ref}} dt, \quad (1)$$

which simplifies to $$\beta_{CP} = \frac{I_{CP}}{2\pi}, \quad (2)$$

where $\Delta\Phi$ corresponds to the phase difference (between the reference signal and the output signal) detected at the PD, neglecting any steady state phase offsets. Since there is no divider in the feedback loop and the ratio N is not controlled by such divider, the transfer function gain of the PD and the CP is not divided by N. In consequence, there is no PD/CP $N^2$ noise presented in the PLL 100 as in traditional PLLs.

In addition, there is a significant advantage in placing the SH block 18 after the LPF 16, which follows the CP 12, rather than placing the SH block 18 before the PD 10 as in a SSPLL. Because the signal being sampled has already been low-pass filtered, it is well within the first Nyquist zone of the SH block 18. This prevents aliasing problems and significantly reduces the potential for aperture error. Furthermore, any errors introduced from the sampling operation are downstream of both the PD 10 and the CP 12. Therefore, the associated output error is $K_{PD}K_{CP}$ times lower than if the same error had been injected prior to the PD 10 and the CP 12 as in the SSPLL.

Figure 6A:
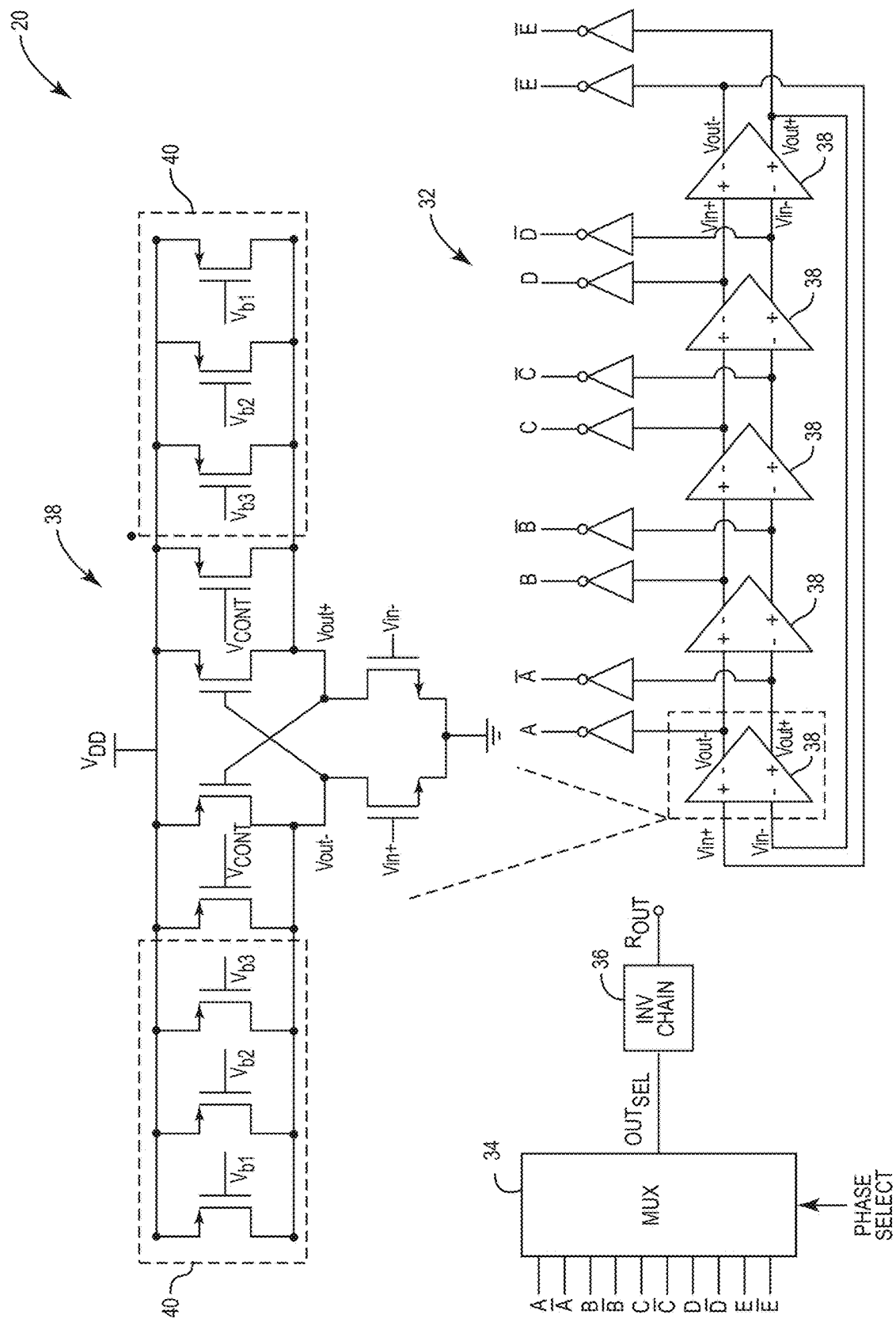
FIGS. 6A and 6B show a voltage-controlled oscillator (VCO) structure in the PLL shown in FIG. 2.
Figure 6B:
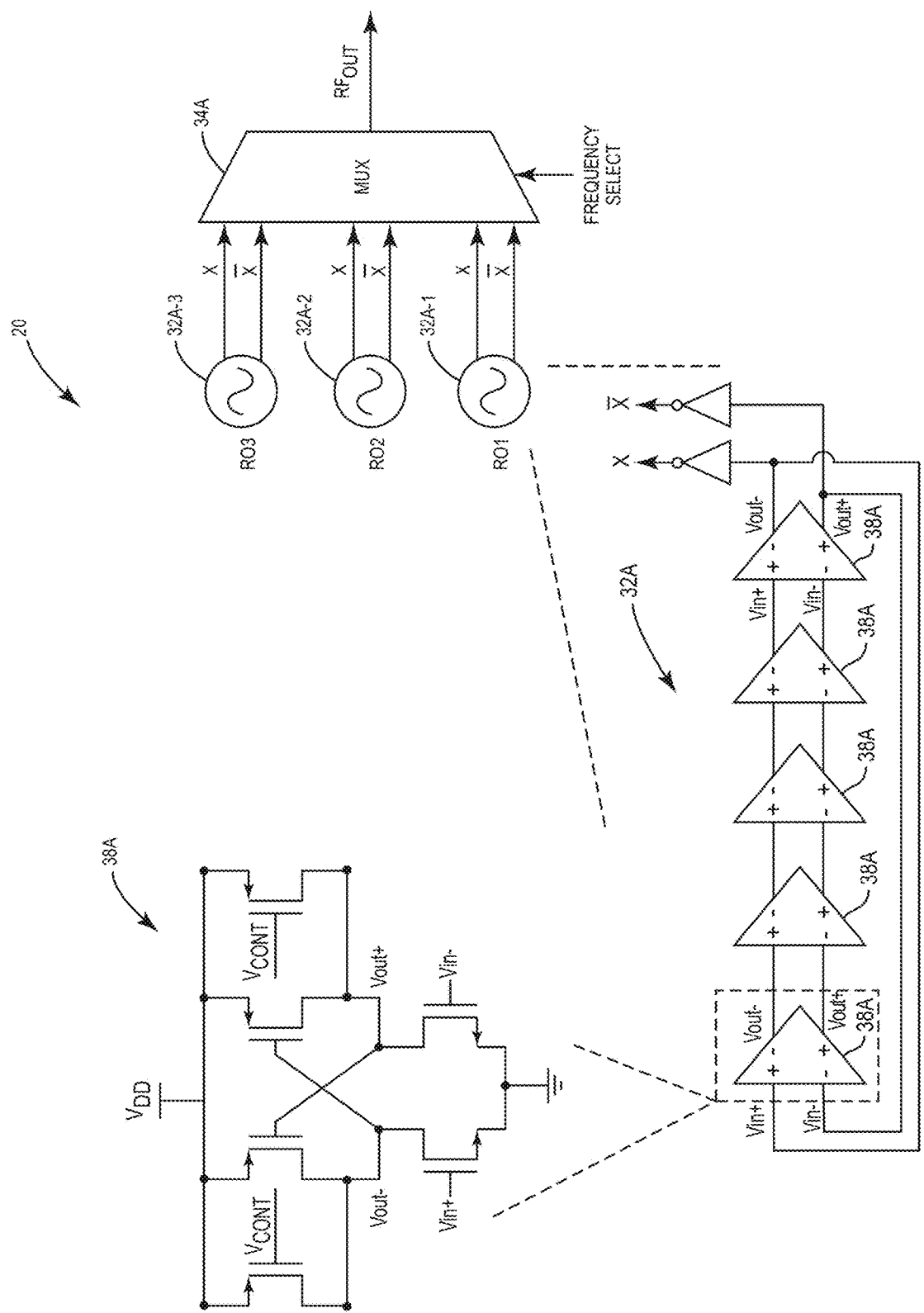

The VCO structure 20 follows the SH block 18 and is configured to tune the RF output signal $RF_{OUT}$ based on the oscillator control voltage $V_{cont}$. FIGS. 6A and 6B show exemplary schematics of the VCO structure 20 used in the PLL 100. In FIG. 6A, the VCO structure 20 includes a multi-stage differential ring oscillator 32, a multiplexer 34, and an inverter chain 36. The multi-stage differential ring oscillator 32 includes multiple delay stages 38. Herein, stage outputs (Vout+ and Vout−) of one delay stage 38 are stage inputs (Vin− and Vin+, respectively) of the next adjacent delay stage 38. For the purpose of this illustration, the multi-stage differential ring oscillator 32 have five delay stages 38 with five oscillator output pairs (A&$\overline{A}$, B&$\overline{B}$, C&$\overline{C}$, D&$\overline{D}$, and E&$\overline{E}$), and the multiplexer 34 is a 10:1 multiplexer. Each delay stage 38 corresponds to one oscillator output pair (A&$\overline{A}$, B&$\overline{B}$, C&$\overline{C}$, D&$\overline{D}$, or E&$\overline{E}$), and the stage outputs (Vout+ and Vout−) of each delay stage 38 are coupled to a corresponding oscillator output pair (A&$\overline{A}$, B&$\overline{B}$, C&$\overline{C}$, D&$\overline{D}$, or E&$\overline{E}$). These oscillator output pairs (A&$\overline{A}$, B&$\overline{B}$, C&$\overline{C}$, D&$\overline{D}$, and E&$\overline{E}$), which have a same frequency with different phases, are coupled to inputs of the multiplexer 34. The multiplexer 34 is configured to select an output signal $OUT_{SEL}$ with a desired phase from these oscillator output pairs (A&$\overline{A}$, B&$\overline{B}$, C&, D&$\overline{D}$, and E&$\overline{E}$) of the multi-stage differential ring oscillator 32. The selected output signal $OUT_{SEL}$ is fed to an input of the inverter chain 36 and an output of the inverter chain 36 provides the RF output signal $RF_{OUT}$. The inverter chain 36 is configured to boost the signal's drive strength to be able to sufficiently drive off chip loads. This inverter chain 36 may have a small effect on the noise performance. In different applications, the multi-stage differential ring oscillator 32 may have fewer or more delay stages 38, and the multiplexer 34 may have a different radio of inputs vs. outputs.

In one embodiment, each delay stage 38 contains frequency range selection circuitry 40 configured to choose the RF output frequency range, within which the VCO structure 20 is tuning the RF output signal $RF_{OUT}$. Herein the frequency range selection circuitry 40 is controlled by three digital tuning bits of $V_{b1}$, $V_{b2}$, and $V_{b3}$. In different applications, there might be fewer or more bits used to determine the RF output frequency range. Herein, each bit-code of three digital tuning bits (like $V_{b1}$ $V_{b2}$ $V_{b3}$="111", "110", "101", "100", "011", "010", "001", or "000") has an analog tuning range of 100 MHz-300 MHz, depending on the bit-code. The total reconfigured frequency range may be approximately 1.6 GHz-2.5 GHz. By lowering the supply voltage $V_{DD}$ down to 0.9V, the VCO structure 20 may be able to operate as low as 1.2 GHz. Each delay stage 38 receives the oscillator control voltage $V_{cont}$, which is configured to tuning the RF output of the VCO structure 20 within the chosen RF output frequency range decided by the digital tuning bits $V_{b1}$, $V_{b2}$, and $V_{b3}$.

While ring oscillators are highly suboptimal for noise, they do have the advantages of small areas, low power consumption, polyphase outputs, and ease of integration with deep sub-micron processes. However, the concept of dividerless frequency upconversion is dependent only on the PD, not the VCO structure itself. As such, any VCO with appropriate characteristics (e.g. center frequency, frequency gain, etc.) could theoretically be substituted in the presented PLL without loss of generality. The oscillator topologies may also be used in the presented PLL architecture, including but not limited to: a current starved ring oscillator, an LC tank, a positive feedback oscillator, a tunable crystal oscillator, a varactor based oscillator, a rotary travelling wave oscillator, a tunable microstrip oscillator, and a tunable cavity resonator.

In another embodiment, the VCO structure 20 utilized in the PLL 100 may include several multi-stage differential ring oscillators 32A and a multiplexer 34A coupled to each of the multi-stage differential ring oscillators 32A, as illustrated in FIG. 6B. For the purpose of this illustration, the VCO structure 20 includes three multi-stage differential ring oscillators 32A (32A-1, 32A-2, and 32A-3), each multi-stage differential ring oscillator 32A corresponds to an oscillator output pair (X and $\overline{X}$) and has five delay stages 38A, and the multiplexer 34A is a 6:1 multiplexer. In different applications, the VCO structure 20 may include fewer or more multi-stage differential ring oscillators 32A, each multi-stage differential ring oscillator 32A may have fewer or more delay stages 38A, and the multiplexer 34A may have a different radio of inputs vs. outputs.

Herein, each delay stage 38A does not include any frequency range selection circuitry. As such each multi-stage differential ring oscillator 32A may only provide one fixed frequency range. However, the three multi-stage differential ring oscillators 32A-1, 32A-2, and 32A-3 may provide different frequency ranges (by using different sizes/types of transistors). The oscillator output pair (X and $\overline{X}$) of each multi-stage differential ring oscillator 32A is coupled to inputs of the multiplexer 34A, which is used to select one multi-stage differential ring oscillator 32A within a desired frequency range for a locking process.

Figure 7:
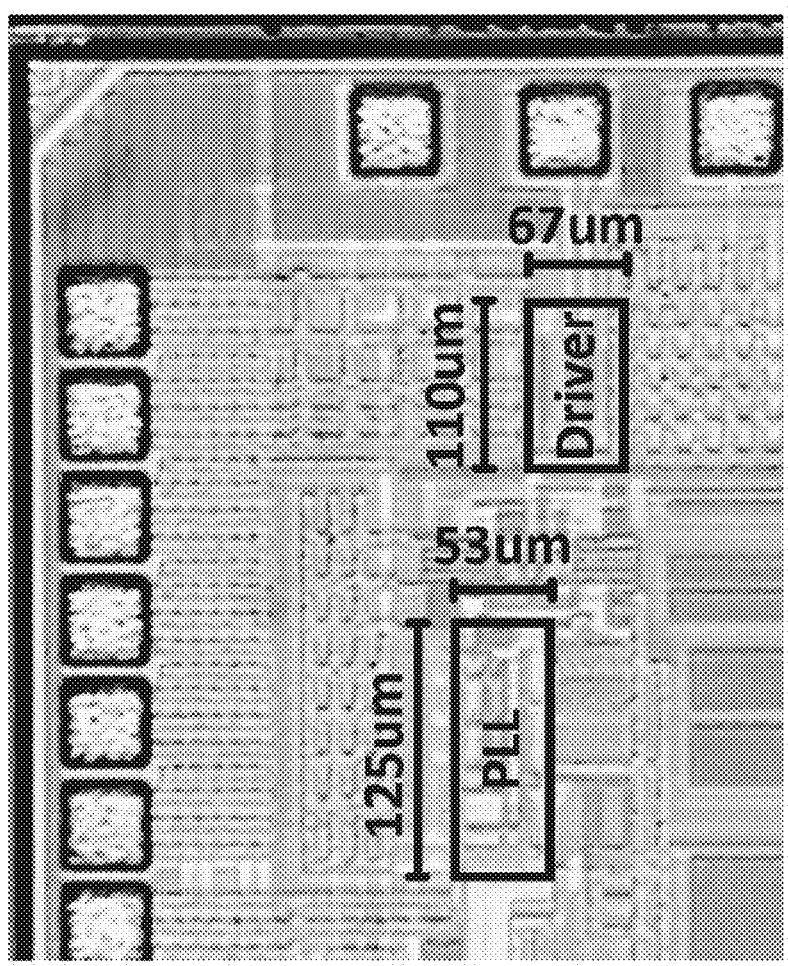
FIG. 7 shows a chip micrograph.

The presented PLL 100 can be fabricated in 65 nm bulk complementary metal-oxide-semiconductor (CMOS). The active area of the PLL 100 is 0.0066 mm$^2$. Additionally, 0.0074 mm$^2$ is used for the on-chip driver, which allows the signal to drive off-chip loads. A micrograph of the PLL 100 is shown in FIG. 7.

FIGS. 8-13 show some measurement results of the PLL 100, which validate above conclusions. To demonstrate the integer-N synthesis capabilities of the presented PLL 100, the output frequency is measured as a function of the reference frequency. A plot of the RF output frequency $f_{RF}$ vs. the reference frequency $f_{REF}$ is included in FIG. 8. During these tests, a power supply of the PLL 100, VDD, and the digital tuning bits ($V_{b1}$, $V_{b2}$, $V_{b3}$) were kept constant, and the reference frequency $f_{REF}$ was swept from 100 MHz to 1.7 GHz using an external signal source. As can be seen, the PLL 100 was able to lock over the entire range of input frequencies, and each reference frequency $f_{REF}$ has a 1:1 correspondence with its nearest integer multiple within the VCO structure 20 tuning range. The slope of the lines is equal to their respective effective multiplication factor N between the reference signal frequency $f_{REF}$ and the RF output signal frequency $f_{RF}$. Drawing regression lines (dashed lines) shows that all lines intersect at the origin, which indicates that there are no frequency offset errors during synthesis.

The limit to the maximum value of N is determined by the bandwidth of the VCO structure 20. As with most SSPLLs, the bandwidth of the VCO structure 20 should be less than the reference frequency $f_{REF}$. Since sub-sampling systems cannot distinguish between the N$^{th}$ and (N+1)$^{th}$ harmonic of the reference signal REF, the output of the PLL 100 may lock to a wrong harmonic if both harmonics lie within the VCO structure 20 tuning range. If the VCO structure 20 has a minimum bandwidth of approximately 100 MHz/bit-code, the minimum reference frequency $f_{REF}$ for this system may also be approximately 100 MHz, though the exact value will vary as a function of the VCO bandwidth at each particular frequency. At an RF output frequency $f_{RF}$ of 1.6 GHz, a 100 MHz bandwidth corresponds to a maximum N of 16. To accomplish larger values of N, the PLL 100 may include an auxiliary frequency lock loop (FLL), utilize more narrow-band VCO structures 20, or rely on locking-enhancement schemes, such as a 2-step lock technique.

Figure 10:
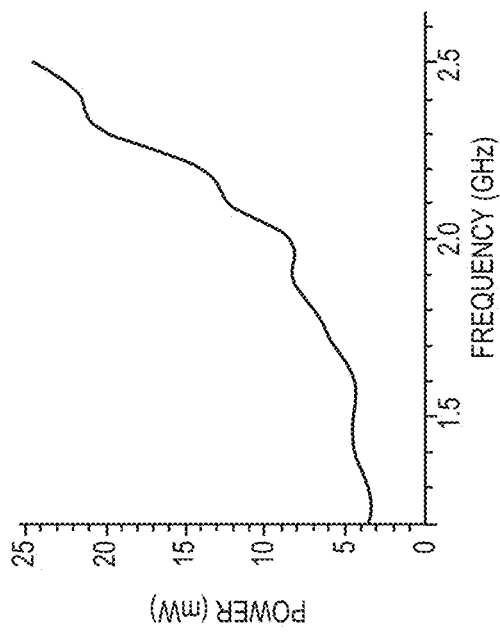
FIGS. 8-13 show measurement results.
Figure 9:
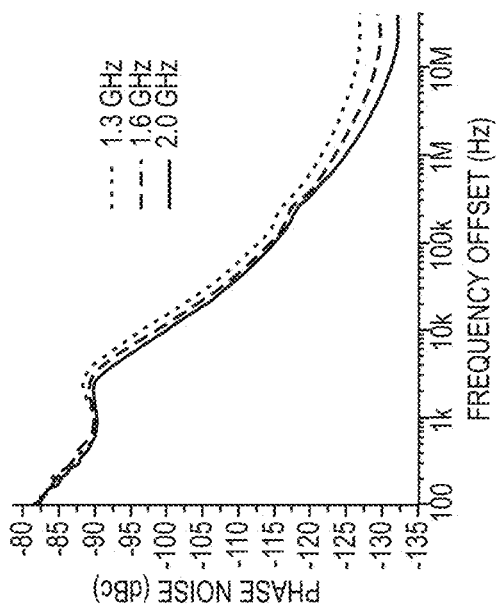

FIG. 9 shows a plot of the PLL 100 phase noise (PN) at various frequencies. The choice of frequencies is arbitrary, but covers lower, mid, and upper frequency ranges. Other frequencies yield similar PN plots. It can be seen from the plots that the noise profiles show minimal change over frequency. The integrated jitter calculated for these curves using an integration window of 10 kHz-40 MHz yields 618 fs, 380 fs, and 250 fs for frequencies of 1.3 GHz, 1.6 GHz, and 2.0 GHz respectively. A power dissipation plot for the RF output frequency $f_{RF}$ is illustrated in FIG. 10. The combined figure of merit (FoM) for these frequencies is −238.7 dB, −241.9 dB, and −242.7 dB respectively. The increase in far-out PN at lower output frequencies is a consequence of the VCO structure 20 having higher open-loop noise at low frequencies/supply voltages.

Figure 11:
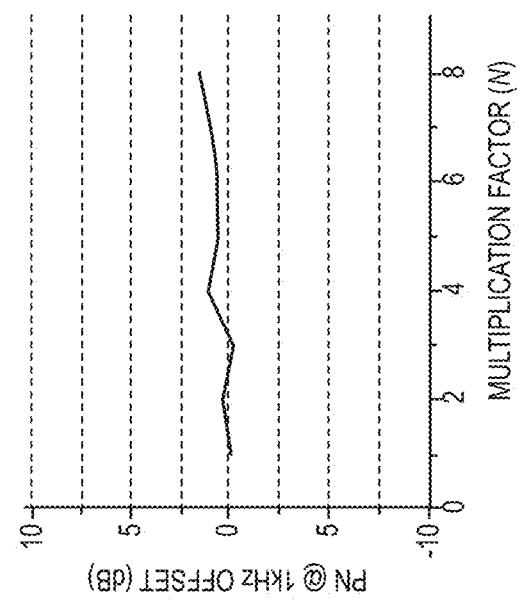
Figure 8:
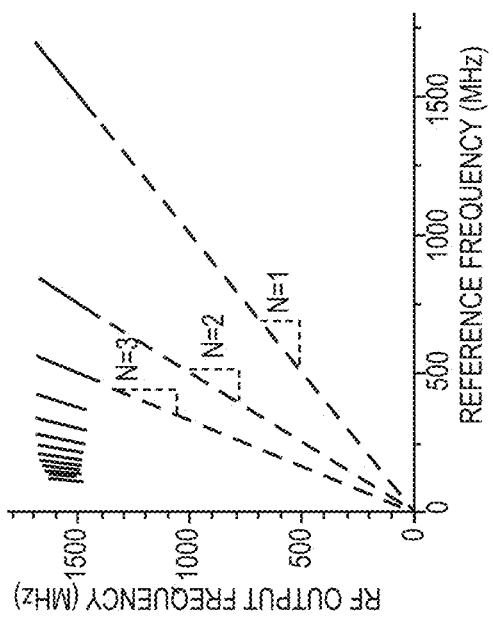

A plot of the change in measured in-band PN for various values of N (fixed $V_{DD}$ and digital tuning bits) is illustrated in FIG. 11. It can be seen that the in-band PN is largely independent of the value of N. This particular plot was generated for an output of 2.2 GHz, but other frequencies yield similar plots. The fact that the in-band PN shows no dependence on N proves that the presented architecture has the in-band PN performance benefits of the SSPLL, without the associated area and power overheads.

Figures 12, 13:
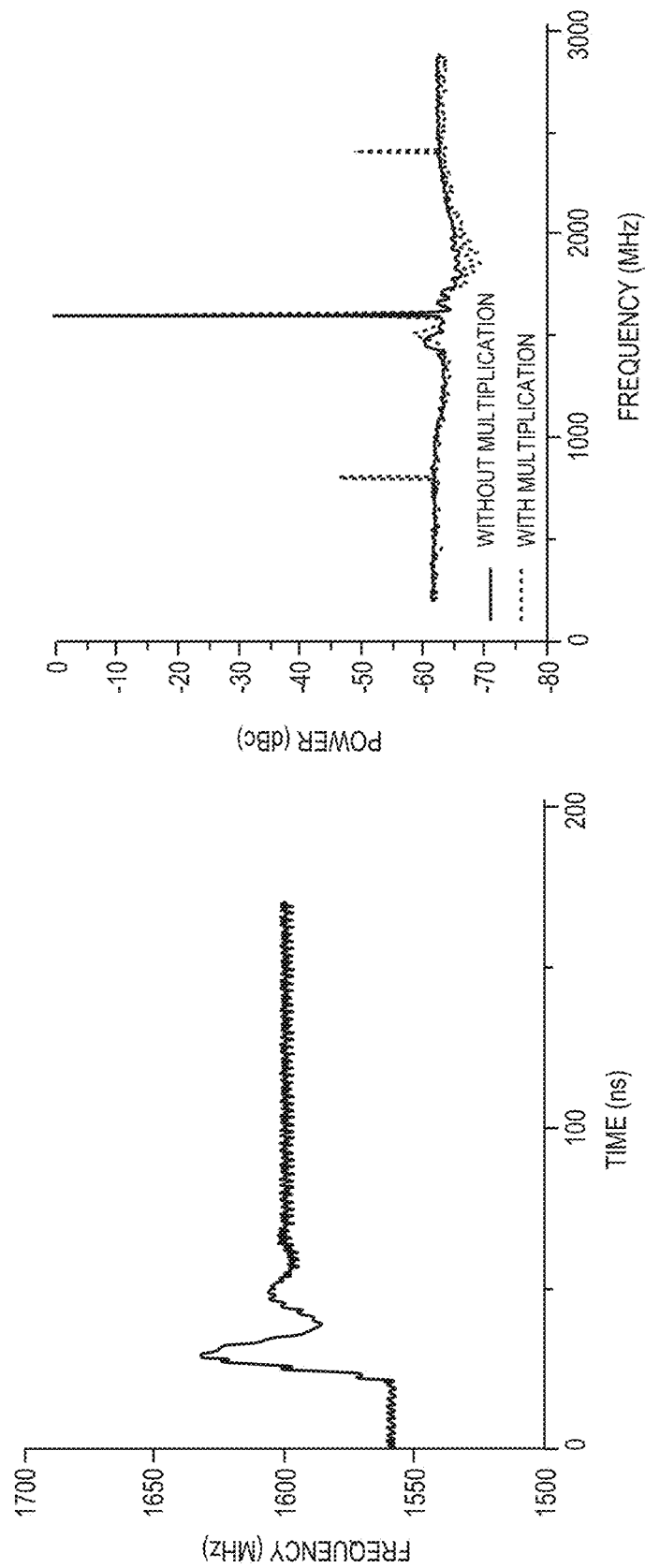

In addition, FIG. 12 shows a plot of the transient settling response of the PLL 100. Due to measurement constraints, this figure is simulation only, and is generated using fully post-extracted models. This particular case is generated for the case where the RF output frequency $f_{RF}$ is firstly locked at 1560 MHz and then needs to be locked at 1600 MHz. The reference frequencies $f_{REF}$ used are 390 MHz and 400 MHz respectively. As can be seen, the presented PLL 100 demonstrates standard damped second order settling behavior with a settling time of approximately 75 ns. While the particular case of the 40 MHz jump was chosen as an arbitrary example, similar damping coefficients are yielded for other frequencies and division ratios.

Further, a plot of the measured spectrum of the RF output signal $RF_{OUT}$ outputting a 1.6 GHz peak is provided in FIG. 13. The solid trace represents the PLL 100 running with no frequency upconversion. As can be seen, the spectrum is free from any significant spurs. The dashed trace represents the PLL 100 running with integer-N synthesis enabled for N=2. It can be seen that there are a pair of −46 dBc spurs located at a frequency offset equal to the reference frequency $f_{REF}$. Similar magnitude spurs may be generated for other values of N, but with frequency offsets equal to their respective reference frequencies $f_{REF}$. As the minimum reference frequency for this system is approximately 100 MHz, reference spurs should never have offsets smaller than 100 MHz. The center frequency of 1.6 GHz was chosen to correspond to the same frequency range as FIG. 12, but similar results are yielded for all valid frequencies.

The presented PLL 100 demonstrates significant reduction of the in-band noise. Particularly, the presented PLL 100 is similar to a conventional SSPLL in that it does not exhibit PD/CP $N^2$ noise associated with traditional PLLs. In addition, the presented PLL 100 also mitigates many of the issues associated with SSPLLs. For instance, the presented PLL 100 is not susceptible to aperture or pedestal errors and does not require variable current sources in the CP 12. The SH block 18 of the presented PLL 100 does not need to sample high frequency signals. Measurement results yield an integrated jitter of 250 fs, FoM of −242.7 dB, and PN of −124.8 dBc at 1 MHz offset. Further, the presented PLL 100 occupies a superior small area (0.0066 mm$^2$).

The presented PLL 100 may be in conjunction with different circuitry architecture for enhanced and/or flexible performances. In one embodiment, the presented PLL 100 may be in conjunction with an auxiliary loop for enhanced frequency acquisition purposes. In one embodiment, the presented PLL 100 may accommodate an optional divider in the feedback loop to generate a hybrid between the divid-erless architecture and a standard PLL with the divider. In one embodiment, the presented PLL 100 may include peripheral circuitry used for calibration. In one embodiment, the presented PLL 100 may be in conjunction with auxiliary feed-forward paths for linearity enhancement. In one embodiment, the presented PLL 100 may be in conjunction with other frequency multiplication circuits.

In addition, the presented PLL 100 may utilize different techniques and may be fabricated in different processes. In one embodiment, the presented PLL 100 may utilize spur reduction techniques. In one embodiment, the presented PLL 100 may utilize equivalent differential circuits. In one embodiment, the presented PLL 100 may be implemented in a tunable or reconfigurable fashion.

In one embodiment, the presented PLL 100 may be fabricated by a semiconductor process, including but not limited to BiCMOS, GaN, SiGe, Mesfet, JFETs, HEMTs, Laterally diffused MOSFETs, or CMOS of dimensions other than 65 nm.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A phased-locked loop (PLL) comprising:
a voltage-controlled oscillator (VCO) structure configured to generate a radio frequency (RF) output signal;
a phase detector (PD) configured to receive a reference signal and the RF output signal, and configured to generate detection signals, which indicate a phase relationship between the reference signal and the RF output signal;
a charge pump (CP) configured to receive the detection signals and generate a CP current; and
a sampled lowpass filter structure, wherein:
the CP current flows into or out of the sampled lowpass filter structure based on the detection signals;
the sampled lowpass filter is configured to provide an oscillator control voltage to the VCO structure based on the CP current, wherein the oscillator control voltage remains constant within a cycle of the reference signal;
the VCO structure comprises a multiplexer and a plurality of multi-stage differential ring oscillators, each of which is configured to provide a different RF output frequency range for tuning the RF output signal;

each of the plurality of multi-stage differential ring oscillators corresponds to an oscillator output pair and has a plurality of delay stages, wherein the oscillator control voltage is fed to each of the plurality of delay stages;

the oscillator output pair of each of the plurality of multi-stage differential ring oscillators is coupled to inputs of the multiplexer; and the multiplexer is configured to select one of the plurality of multi-stage differential ring oscillators for tuning the RF output signal within a desired RF output frequency range.

2. The PLL of claim 1 wherein the sampled lowpass filter structure includes a lowpass filter (LPF) placed after the CP and a sample-and-hold (SH) block placed after the LPF, wherein:

the LPF includes a ripple rejection capacitor coupled to the CP, wherein:

when the CP current flows into the LPF, the ripple rejection capacitor is charged, and a filter voltage on the ripple rejection capacitor increases; and when the CP current flows out of the LPF, the ripple rejection capacitor is discharged, and the filter voltage on the ripple rejection capacitor decreases; and the SH block is configured to sample the filter voltage and configured to provide the oscillator control voltage.

3. The PLL of claim 2 wherein the SH block is configured to sample the filter voltage at a rate equal to the reference frequency.

4. The PLL of claim 2 wherein the SH block includes a holding capacitor and a sampling circuit coupled between the ripple rejection capacitor of the LPF and the holding capacitor, wherein:

the sampling circuit is configured to allow only one value of the filter voltage to pass per cycle of the reference signal, wherein the passed value of the filter voltage is the oscillator control voltage; and the holding capacitor is configured to hold the oscillator control voltage and provide a constant voltage value to the VCO structure per cycle of the reference signal.

5. The PLL of claim 4 wherein the sampling circuit is implemented by a transmission gate.

6. The PLL of claim 5 wherein the sampling circuit is controlled by a SAMPLE signal, which pulses per cycle of the reference signal.

7. The PLL of claim 6 wherein the SAMPLE signal pulses are based on the detection signals.

8. The PLL of claim 5 wherein the sampling circuit is controlled by a SAMPLE signal, which pulses every M cycles of the reference signal, wherein M is a positive integer.

9. The PLL of claim 5 wherein the sampling circuit is controlled by a SAMPLE signal, which pulses M times per cycle of the reference signal, wherein M is a positive integer.

10. The PLL of claim 2 wherein the CP includes a current mirror configuration to set the CP current, wherein the current mirror configuration is configured such that a current amount supplied to the ripple rejection capacitor during the charging period and a current amount drawn from the ripple rejection capacitor during the discharging period are equal within a cycle of the RF output signal, such that the filter voltage on the ripple rejection capacitor has a net zero change for a cycle of the RF output signal.

11. The PLL of claim 10 wherein the CP further includes a charge injection cancellation circuit, which is configured to cancel charge injection generated at the current mirror configuration during the charging and discharging periods.

12. The PLL of claim 1 wherein there is no divider in a feedback loop between the VCO structure and the PD.

13. The PLL of claim 1 wherein the PD has a pre-charged topology.

* * * * *